United States Patent
Otani et al.

(10) Patent No.: US 11,227,783 B2
(45) Date of Patent: Jan. 18, 2022

(54) TRANSFER DEVICE

(71) Applicant: Sinfonia Technology Co., Ltd., Tokyo (JP)

(72) Inventors: Junichi Otani, Tokyo (JP); Manabu Funato, Tokyo (JP); Tatsuya Hirota, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 280 days.

(21) Appl. No.: 16/458,759

(22) Filed: Jul. 1, 2019

(65) Prior Publication Data
US 2020/0013653 A1    Jan. 9, 2020

(30) Foreign Application Priority Data
Jul. 3, 2018  (JP) ............................. JP2018-127106

(51) Int. Cl.
| | | |
|---|---|---|
| *H01L 21/68* | (2006.01) | |
| *H01L 21/677* | (2006.01) | |
| *B65G 47/60* | (2006.01) | |
| *H01L 21/687* | (2006.01) | |
| *B25J 9/10* | (2006.01) | |

(52) U.S. Cl.
CPC ........ *H01L 21/67742* (2013.01); *B25J 9/107* (2013.01); *B65G 47/60* (2013.01); *H01L 21/68* (2013.01); *H01L 21/68707* (2013.01)

(58) Field of Classification Search
CPC ...... B25J 11/0095; B25J 9/1664; B25J 9/107; H01L 21/67742; H01L 21/68707; H01L 21/68; B65G 47/60
See application file for complete search history.

(56) References Cited

FOREIGN PATENT DOCUMENTS

| JP | 3806812 | 8/2006 | |
|---|---|---|---|
| JP | 3806812 B2 * | 8/2006 | ....... H01L 21/67742 |

* cited by examiner

*Primary Examiner* — Randell J Krug
(74) *Attorney, Agent, or Firm* — Kilpatrick Townsend & Stockton LLP

(57) ABSTRACT

A transfer device includes a first parallel four-joint link mechanism in which base end portions of a pair of first links are rotatably connected to a first link base and distal end portions of the first links are rotatably connected to an intermediate link base, a second parallel four-joint link mechanism in which base end portions of a pair of second links are rotatably connected to the intermediate link base and distal end portions of the second links are rotatably connected to a second link base, and a belt transmission mechanism including a pair of first pulleys respectively connected to the first links, a second pulley connected to one of the second links, and a belt provided around the first pulleys and the second pulley. The belt transmission mechanism transmits a rotational driving force such that the first links and the second links rotate in opposite directions to each other.

12 Claims, 6 Drawing Sheets

TRANSFER DEVICE

CROSS-REFERENCE TO RELATED APPLICATION

This application is based upon and claims the benefit of priority from Japanese Patent Application No. 2018-127106, filed on Jul. 3, 2018, the entire contents of which are incorporated herein by reference.

TECHNICAL FIELD

The present disclosure relates to a transfer device for transferring a workpiece, for example, in a semiconductor manufacturing apparatus, a liquid crystal substrate manufacturing apparatus, and the like.

BACKGROUND

In the related art, there is known a transfer robot device that horizontally and linearly moves a hand member for mounting a workpiece, for example, a wafer, through the use of an arm in a semiconductor manufacturing apparatus, a liquid crystal substrate manufacturing apparatus, and the like.

In a transfer robot device of the related art, as shown in FIGS. 1 and 2 of Patent Document 1, a swivel base 11 and an outer second link 14 are connected by a pair of first intermediate links 12 and 13 to form a first parallel four-joint link 15, and a second link 14 and a hand link 18 are connected by a pair of second intermediate links 16 and 17 to form a second parallel four-joint link 19. The first intermediate links 12 and 13 and the second intermediate links 16 and 17 are formed to have the same link length, and the swivel base 11 and the first intermediate links 12 and 13 are pivoted about a first pivot point O1 and a second pivot point O2 spaced apart in a Y direction. The first intermediate links 12 and 13 and the second link 14 are pivoted about a third pivot O3, and the second intermediate links 16 and 17 and the second link 14 are pivoted about a fourth pivot O4. A rotation transmission mechanism 20 is disposed between the first and second intermediate links.

Therefore, when the first rotation shaft 2 and the first intermediate link 13 are rotated clockwise about the first pivot point O1, the first parallel four-joint link 15 makes parallel movement in a Y1 direction about the first pivot point O1 and the second pivot point O2. In this case, the first intermediate link 13 is rotated clockwise with respect to the second link 14 about the third pivot O3. Thus, the second intermediate link 16 is rotated counterclockwise with respect to the second link 14 about the fourth pivot point O4 via the rotation transmission mechanism 20, and the second parallel four-joint link 19 makes parallel movement in the Y1 direction about the fourth pivot point O4.

As illustrated in FIG. 10 of Patent Document 1, in the transfer robot device, the rotation transmission mechanism 20 is disposed between the first intermediate link 12 and the second intermediate link 17 and disposed between the intermediate link 13 and the second intermediate link 16. That is, a belt 20E is provided between a pulley 20D fixed coaxially with the third pivot point O3 of the first intermediate link 12 and a pulley 20C fixed coaxially with the fourth pivot point O4 of the second intermediate link 17. Furthermore, a belt 20E is provided between a pulley 20D fixed coaxially with the third pivot point O3 of the first intermediate link 13 and a pulley 20C fixed coaxially with the fourth pivot point O4 of the second intermediate link 16.

PRIOR ART DOCUMENTS

Patent Documents

Patent Document 1: Japanese Patent No. 3806812

In the transfer robot device of Patent Document 1, the belt 20E rotates in a loosening direction and the tension of the belt 20E decreases because the pulley 20C connected to the second intermediate links 16 and 17 of the second parallel four-joint link 19 is in a released state. Furthermore, in the transfer robot device of Patent Document 1, when assembling the rotation transmission mechanism 20 with the second link 14, it is necessary to conduct a mounting work of the pulley 20C and the like while simultaneously performing the tension adjustment of the belt 20E and the track adjustment of the arm. Therefore, the assembly and the adjustment are difficult and the productivity is very low. In addition, even if the mounting work is conducted while simultaneously performing the tension adjustment of the belt 20E and the track adjustment of the arm, the stability of the belt tension and the accuracy of the arm parallelism are poor. In order to stabilize the quality, it is necessary to improve the mounting work of the pulley 20C and the like.

SUMMARY

The present disclosure provides a transfer device capable of improving the stability of belt tension and the accuracy of arm parallelism.

According to the present disclosure, there is provided a transfer device including: a first parallel four-joint link mechanism in which base end portions of a pair of first links are rotatably connected to a first link base and distal end portions of the pair of first links are rotatably connected to an intermediate link base, the pair of first links having the same length; a second parallel four-joint link mechanism in which base end portions of a pair of second links are rotatably connected to the intermediate link base and distal end portions of the pair of second links are rotatably connected to a second link base, the pair of second links having the same length; and a belt transmission mechanism that is disposed at the intermediate link base, and includes: a pair of first pulleys respectively connected to the pair of first links; a second pulley connected to one of the pair of second links; and a belt provided around the pair of first pulleys and the second pulley, wherein the belt transmission mechanism is configured to transmit a rotational driving force such that the pair of first links and the pair of second links rotate in opposite directions to each other.

Thus, in the transfer device according to the present disclosure, the belt is provided such that the first pulleys are disposed on both sides of one of the second pulleys. Therefore, even if one of the second pulleys is in a released state, the rotation of the belt is restricted by fixing the belt to the first pulleys. Accordingly, it is possible to prevent the tension of the belt from being reduced due to the rotation of one of the second pulleys having the released state in a loosening direction. Thus, the stability of the belt tension is improved.

In the transfer device according to the present disclosure, the belt transmission mechanism may include a tension adjustment part configured to adjust tension of the belt.

Thus, in the transfer device according to the present disclosure, when assembling the belt transmission mechanism with the intermediate link base, the tension adjustment of the belt and the track adjustment of the arm can be performed separately. Thus, the mounting work of the pulley and the like is easy, the productivity is improved, and the stability of the belt tension and the accuracy of the arm parallelism are improved.

In the transfer device according to the present disclosure, the tension adjustment part may include a pressing member configured to be movable with respect to the intermediate link base such that a pressing force against the belt is changed.

As a result, in the transfer device according to the present disclosure, it is possible to easily form the tension adjustment part.

In the transfer device according to the present disclosure, the tension adjustment part may include one pressing member.

Thus, in the transfer device according to the present disclosure, the tension of the belt can be adjusted by pressing the belt at only one point.

In the transfer device according to the present disclosure, the pressing member may be a driven roller configured to be rotatable along with movement of the belt.

Thus, in the transfer device according to the present disclosure, since the pressing member is a driven roller that rotates along with the movement of the belt, as compared with a case where the pressing member presses the belt in a fixed state, it is possible to reduce the friction of the pressing member with the belt and to make uniform the tension of the belt on both sides of the pressing member.

In the transfer device according to the present disclosure, the belt transmission mechanism may include a rotation restriction part configured to restrict a range in which the other of the pair of second links is rotatable with respect to the intermediate link base.

Thus, in the transfer device according to the present embodiment, breakage of the belt can be prevented by restricting the range in which the other of the second links can rotate with respect to the intermediate link base.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
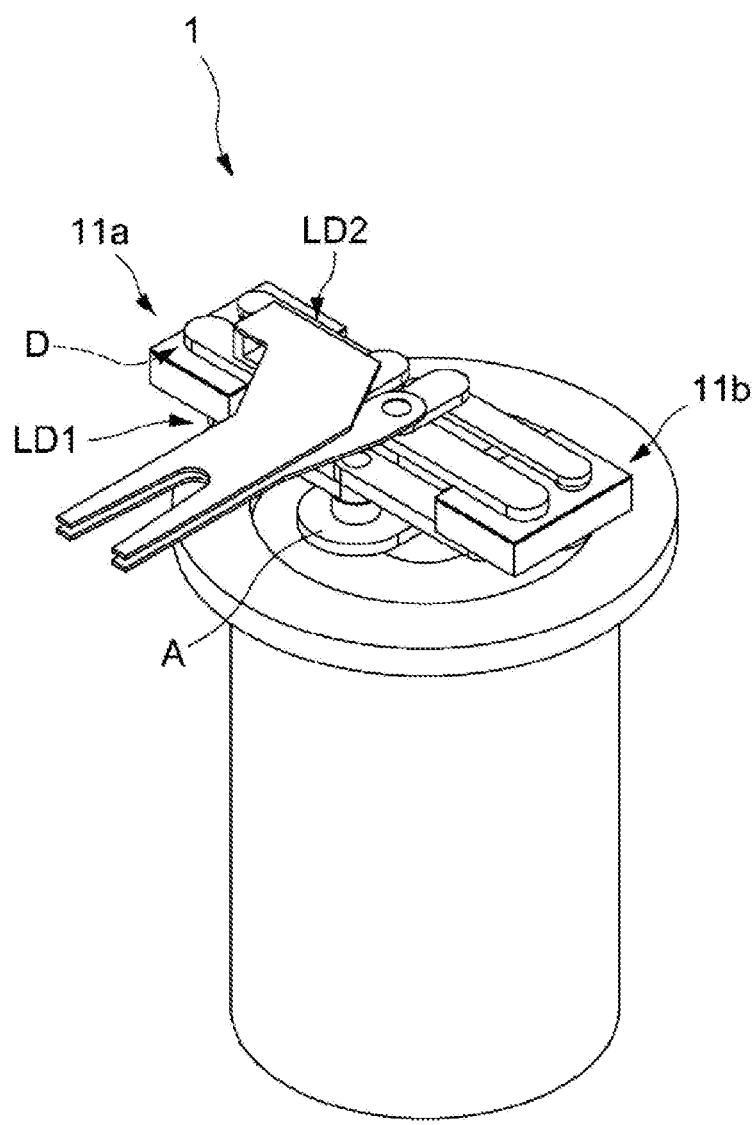
FIG. 1 is a perspective view of a transfer device according to a first embodiment of the present disclosure.
Figure 2:
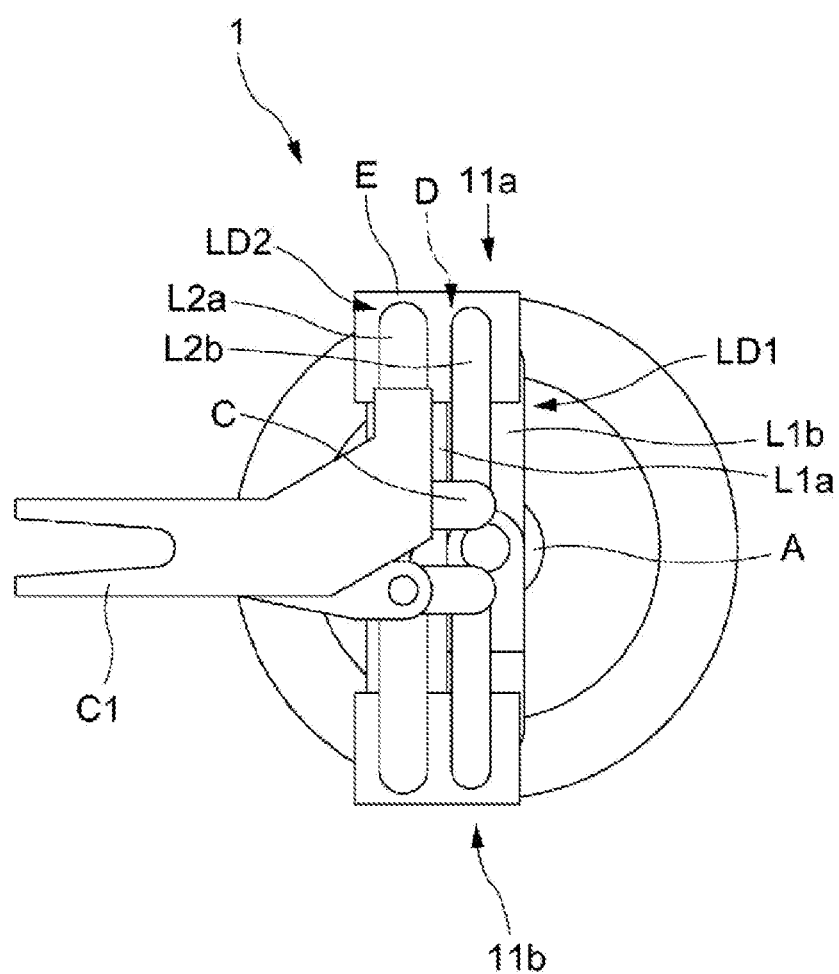
FIG. 2 is a plan view of the transfer device shown in FIG. 1.
Figure 3:
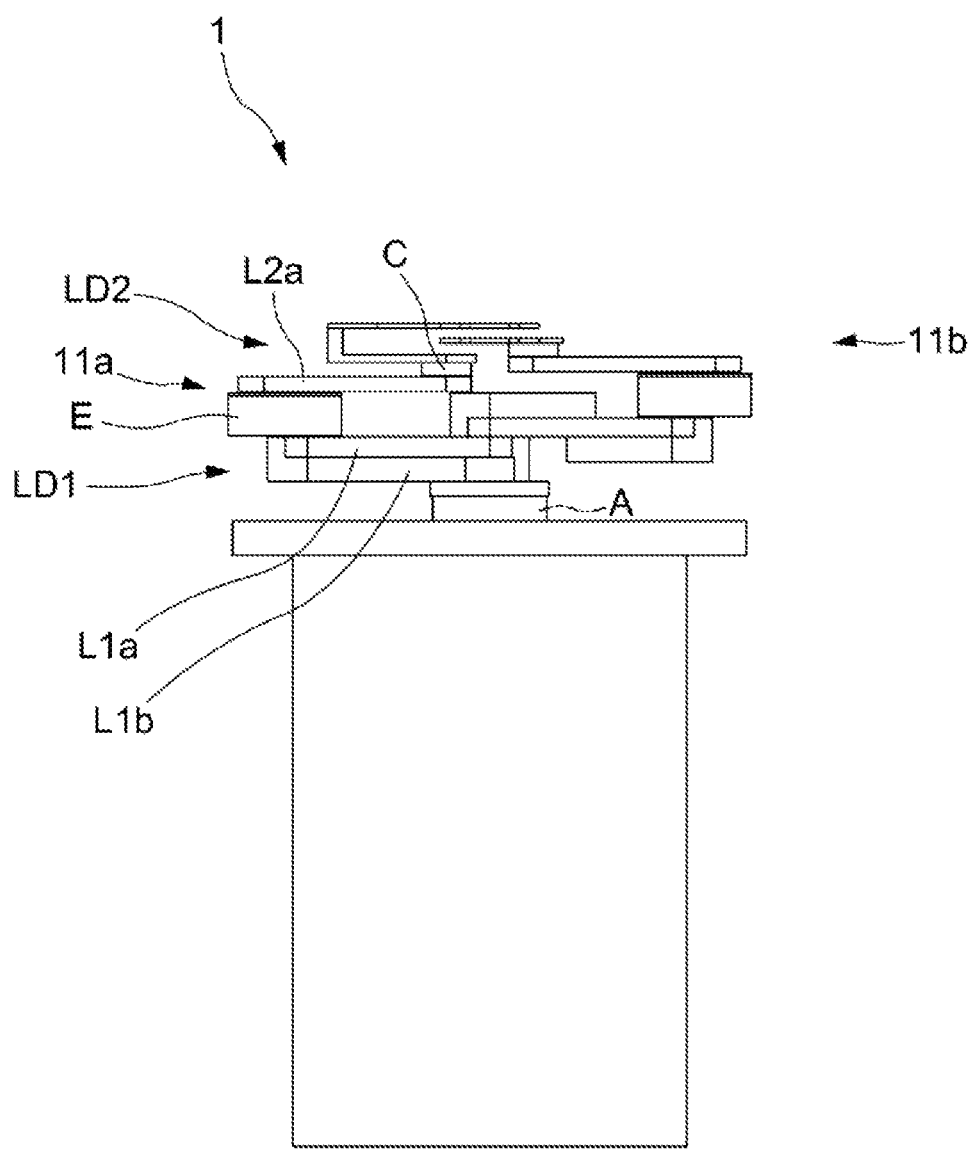
FIG. 3 is a front view of the transfer device shown in FIG. 1.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings.

First Embodiment

As shown in FIGS. 1 to 4, the transfer device 1 is a two-arm type transfer device including two transfer units 11a and 11b having the same basic configuration. The transfer units 11a and 11b are configured to linearly transfer, for example, a wafer as an object to be transferred, on both sides of a fixing base A. Therefore, in the following description, only the transfer unit 11a will be described, and the description of the transfer unit 11b will be omitted.

The transfer unit 11a has a configuration in which a first link mechanism LD1 as a first parallel four-joint link mechanism of the present disclosure and a second link mechanism LD2 as a second parallel four-joint link mechanism of the present disclosure are connected to each other via a belt transmission mechanism D. In the first link mechanism LD1, the base end portions of a pair of first links L1a and L1b having the same length are rotatably connected to the fixing base A via a pair of first connection shafts S1a and S1b, and the distal end portions of the pair of first links L1a and L1b are rotatably connected to an intermediate link base E via a pair of intermediate connection shafts S3a and S3b.

The first connection shaft S1a is rotatably supported by the fixing base A, and the first connection shaft S1a and the first link L are integrally connected to each other. The first connection shaft S1b also serves as a drive shaft S0 driven by a drive part (not shown). The drive shaft S0 (first connection shaft S1b) is rotatably supported by the fixing base A, and the drive shaft S0 (first connection shaft S1b) and the first link L1b are integrally connected to each other. The third connection shaft S3a is rotatably supported by the intermediate link base E, and the third connection shaft S3a and the first link L1a are integrally connected to each other. The third connection shaft S3b is rotatably supported by the intermediate link base E, and the third connection shaft S3b and the first link L1b are integrally connected to each other. The first connection shaft S1a is connected to a rotation shaft S1c (not shown) disposed coaxially with the first connection shaft S1b. When the rotation shaft Sic rotates, the first connection shaft S1a rotates about the rotation shaft S1c (first connection shaft S1b), and the fixing base A rotates. Therefore, when extending and retracting the arm, the rotation shaft S1c is fixed, and only the first connection shaft S1b is rotationally driven. On the other hand, when synchronizing and simultaneously rotating the first connection shaft S1b and the rotation shaft Sic, the fixing base A is rotated, and the extension and retraction direction of the arm may be changed. As described above, in the transfer device 1, only the extension and retraction operation of the arm is possible, and the swivel operation of the fixing base A and the extension and retraction operation of the arm can be performed in parallel.

In the second link mechanism LD2, the base end portions of a pair of second links L2a and L2b having the same length are rotatably connected to the intermediate link base E via a pair of intermediate connection shafts S4a and S4b, and the distal end portions of a pair of second links L2a and L2b are rotatably connected to a distal end link plate C via a pair of second connection shafts S2a and S2b. A wafer mounting table C1 is provided on the top surface of the distal end link plate C.

The intermediate connection shaft S4a is rotatably supported by the intermediate link base E, and the intermediate connection shaft S4a and the second link L2a are integrally connected to each other. The intermediate connection shaft S4b is rotatably supported by the intermediate link base E, and the intermediate connection shaft S4b and the second link L2b are integrally connected to each other. The second connection shaft S2a is rotatably supported by the distal end link plate C, and the second connection shaft S2a and the second link L2a are integrally connected to each other. The second connection shaft S2b is rotatably supported by the distal end link plate C, and the second connection shaft S2b and the second link L2b are integrally connected to each other.

Next, the belt transmission mechanism D for operating the second link mechanism LD2 when the first link mechanism LD1 performs parallel link motion by the rotational driving of the first connection shaft S1b as the drive shaft S0 will be described.

Figure 5:
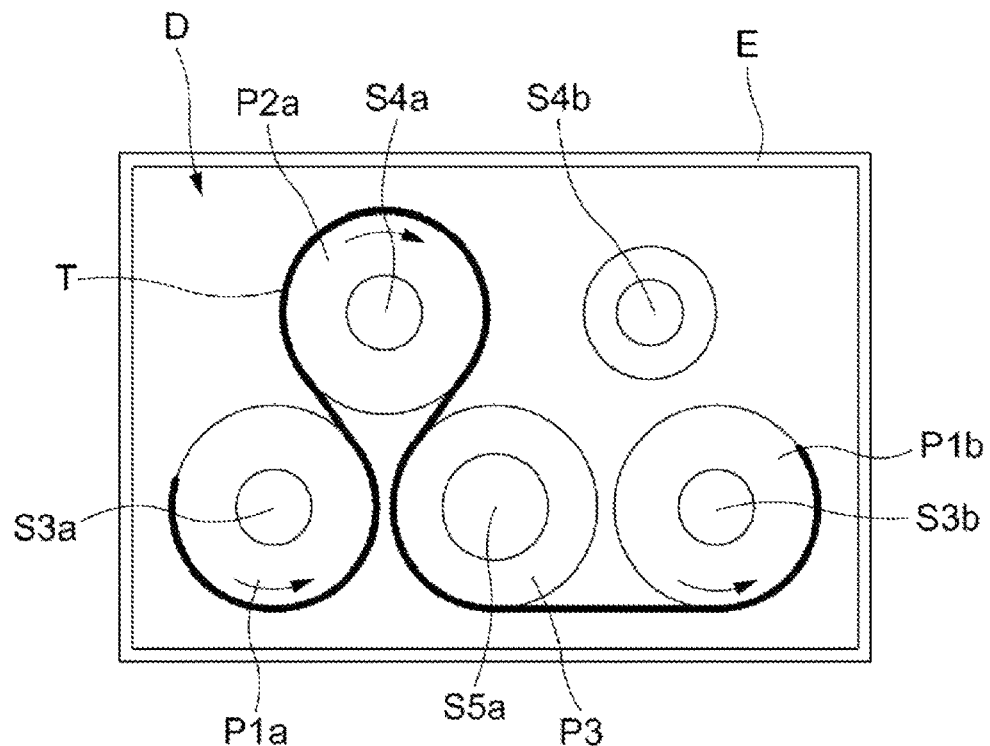
FIG. 5 is a plan view showing a belt transmission mechanism of the transfer device shown in FIG. 1.

As shown in FIG. 5, the belt transmission mechanism D is configured to be built in the intermediate link base E. The belt transmission mechanism D includes pulley bodies P1a, P1b and P2a, a pressing member P3 as a tension adjustment part DT, and a belt T. The pulley body P1a is integrally connected to the third connection shaft S3a connected to the distal end portion of the first link L1a. The pulley body P1b is integrally connected to the third connection shaft S3b connected to the distal end portion of the first link L1b. The pulley body P2a is integrally connected to the fourth connection shaft S4a connected to the distal end portion of the second link L2a.

The distance between the pair of intermediate connection shafts S3a and S3b of the intermediate link base E is the same as the distance between the pair of first connection shafts S1a and S1b of the fixing base A. The distance between the pair of intermediate connection shafts S4a and S4b of the intermediate link base E is the same as the distance between the pair of second connection shafts S2a and S2b of the distal end link plate C.

In the belt transmission mechanism D, the belt T is provided around the outer circumferential surfaces of the pulley bodies P1a, P2a and P1b. The belt T is, for example, a steel belt. As shown in FIG. 5, the belt T is provided so as to extend along the lower side of the outer circumferential surface of the pulley body P1a and then along the upper side of the outer circumferential surface of the pulley body P2a. Thereafter, the belt T extends along the outer circumferential surface of the pressing member P3 and then along the lower side of the outer circumferential surface of the pulley body P1b. The opposite end portions of the belt T are respectively fixed to the outer circumferential portions of the pulley bodies P1a and P1b via a plurality of bolts (not shown).

The pressing member P3 is integrally connected to a shaft S5a rotatably supported by the intermediate link base E and is composed of a driven roller that can rotate as the belt T moves. The pressing member P3 presses the belt T obliquely downward in FIG. 5 to adjust the tension of the belt T between the pulley body P2a and the pulley body P1b. Therefore, the pressing member P3 is movable with respect to the intermediate link base E together with the shaft S5a, and can be fixed to the intermediate link base E together with the shaft S5a in a state in which the belt T is pressed. Thus, the pressing member P3 is configured as a tension adjustment part DT that adjusts the tension of the belt T provided around the pulley bodies P1a, P1b and P2a by moving the belt T with respect to the intermediate link base E so that the pressing force against the belt T changes. In the present embodiment, the tension adjustment part DT includes only one pressing member P3.

Therefore, in the belt transmission mechanism D, when the pulley body P1b connected to the drive shaft S0 (first connection shaft S1b) via the first link L1b rotates, the rotational force of the pulley body P1b is transmitted to the pulley bodies P2a and P1a via the belt T whose tension is adjusted by the tension adjustment part DT (pressing member P3).

For example, when the pulley body P1b rotates counterclockwise in a plan view, the pulley body P2a rotates clockwise in a plan view and the pulley body P1a rotates counterclockwise in a plan view. That is, the pulley body P1a to which the first link L1a of the first link mechanism LD1 is connected, and the pulley body P2a to which the second link L2a of the second link mechanism LD2 is connected, rotate in opposite directions.

Therefore, when the pulley body P1b rotates, the pulley bodies P1a and P1b rotate in a predetermined direction and the first links L1a and L1b rotate with respect to the intermediate link base E. Along with this, the pulley body P2a rotates in the direction opposite to the predetermined direction, and the second links L2a and L2b rotate with respect to the intermediate link base E. That is, the belt T rotates the first links L1a and L1b of the first link mechanism LD1 in a predetermined direction with respect to the intermediate link base E and rotates the pair of second links L2a and L2b of the second link mechanism LD2 in the direction opposite to the predetermined direction with respect to the intermediate link base E.

Figure 4:
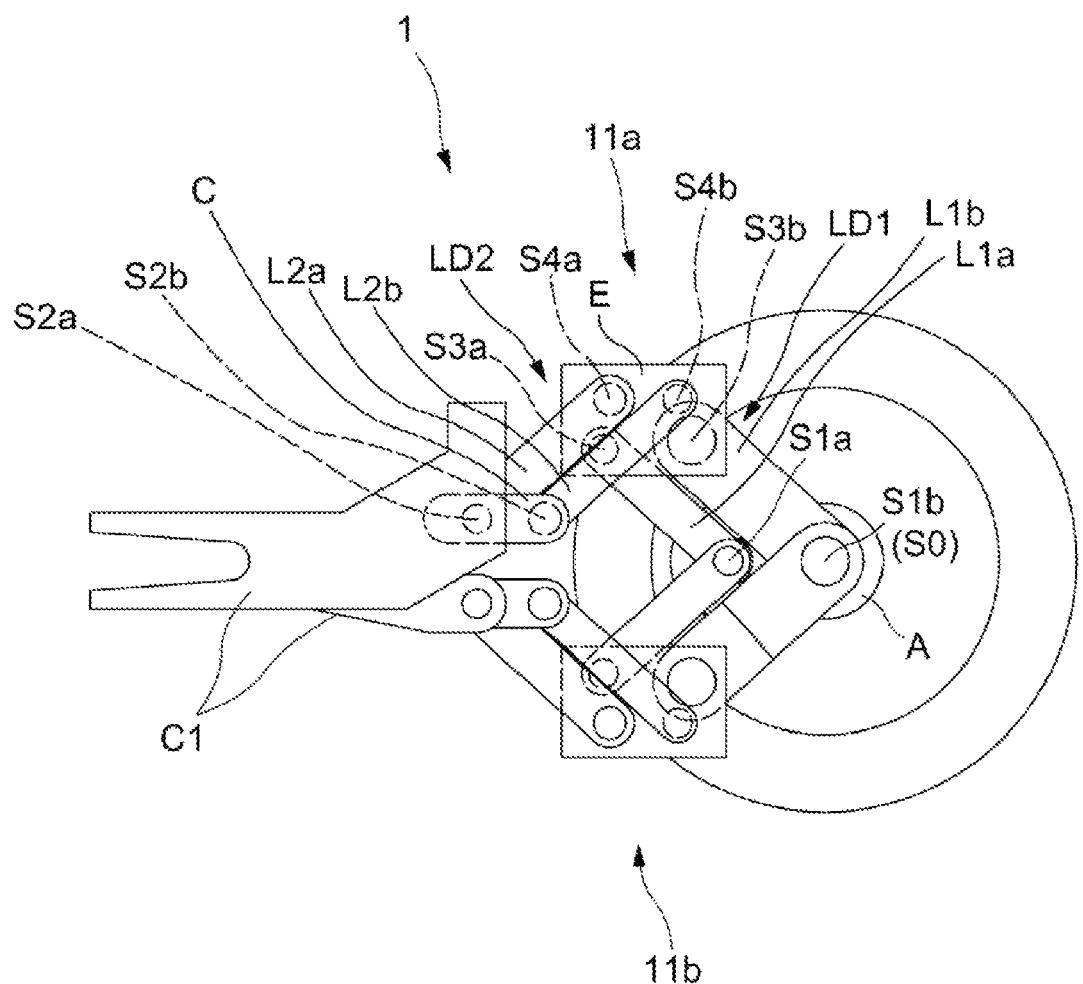
FIG. 4 is a plan view showing a state of linear transfer in the transfer device shown in FIG. 1.

In the present embodiment, when the drive shaft S0 is rotationally driven (when the rotation shaft Sic is fixed and only the first connection shaft S1b is driven), the first connection shaft S1b as the drive shaft S0 is rotationally driven in the fixing base A. When the first link L1b of the first link mechanism LD1 rotates counterclockwise in a plan view with respect to the fixing base A as shown in FIG. 4, the counterclockwise rotational force of the pulley body P1b is transmitted to the pulley bodies P2a and P1a by the belt T so that the pulley body P2a rotates clockwise and the pulley body P1a rotates counterclockwise. Therefore, the first links L1a and L1b of the first link mechanism LD1 rotate counterclockwise in a plan view with respect to the intermediate link base E, and the second links L2a and L2b of the second link mechanism LD2 rotate clockwise in a plan view with respect to the intermediate link base E. Conversely, when the first link L1a of the first link mechanism LD1 rotates clockwise in a plan view with respect to the fixing base A, the clockwise rotational force of the pulley body P1b is transmitted to the pulley bodies P2a and P1a by the belt T so that the pulley body P2a rotates counterclockwise and the pulley body P1a rotates clockwise. Therefore, the first links L1*a* and L1*b* of the first link mechanism LD1 rotate clockwise in a plan view with respect to the intermediate link base E, and the second links L2*a* and L2*b* of the second link mechanism LD2 rotate counterclockwise in a plan view with respect to the intermediate link base E.

That is, the transfer device 1 of the present embodiment includes: the first parallel four-joint link mechanism LD1 in which the base end portions of the pair of first links L1*a* and L1*b* having the same length are rotatably connected to the fixing base A and the distal end portions of the pair of first links L1*a* and L1*b* are rotatably connected to the intermediate link base E; the second parallel four-joint link mechanism LD2 in which the base end portions of the pair of second links L2*a* and L2*b* having the same length are rotatably connected to the intermediate link base E and the distal end portions of the pair of second links L2*a* and L2*b* are rotatably connected to the distal end link plate C; and the belt transmission mechanism D disposed at the intermediate link base E, the belt transmission mechanism D including the pulley bodies P1*a* and P1*b* respectively connected to the first links L1*a* and L1*b*, the pulley body P2*a* connected to the second link L2*a* and the belt T provided around the pulley bodies P1*a* and P1*b* and the pulley body P2*a*, the belt transmission mechanism D configured to transmit a rotational driving force such that the first links L1*a* and L1*b* and the second links L2*a* and L2*b* rotate in opposite directions to each other.

In the transfer device 1 of the present embodiment having such a configuration, the belt T is provided such that the pulley bodies P1*a* and P1*b* are disposed on both sides of the pulley body P2*a*. Therefore, even if the pulley body P2*a* is in a released state, the rotation of the belt T is restricted by fixing the belt T to the pulley bodies P1*a* and P1*b*. Accordingly, it is possible to prevent the tension of the belt T from being reduced due to the rotation of the pulley body P2*a* having the released state in a loosening direction. Thus, the stability of the belt tension is improved.

In the transfer device 1 of the present embodiment, the belt transmission mechanism D includes the tension adjustment part DT configured to adjust the tension of the belt T.

In the transfer device 1 of the present embodiment having such a configuration, when assembling the belt transmission mechanism D with the intermediate link base E, the tension adjustment of the belt T and the track adjustment of the arm can be performed separately. Thus, the mounting work of the pulley and the like is easy, the productivity is improved, and the stability of the belt tension and the accuracy of the arm parallelism are improved. In the present embodiment, for example, the belt transmission mechanism D is assembled with the intermediate link base E, and the tension of the belt T is adjusted. Then, the second links L2*a* and L2*b* of the second link mechanism LD2 can be assembled with the intermediate link base E while adjusting the parallelism with respect to the pulley body P2*a*.

In the transfer device 1 of the present embodiment, the tension adjustment part DT is the pressing member P3 configured to be movable with respect to the intermediate link base E to change the pressing force against the belt T.

In the transfer device 1 of the present embodiment having such a configuration, it is possible to easily form the tension adjustment part DT configured to adjust the tension of the belt T.

In the transfer device 1 of the present embodiment, the tension adjustment part DT includes only one pressing member P3.

Thus, in the transfer device 1 of the present embodiment, the tension of the belt T can be adjusted by pressing the belt T at only one point.

In the transfer device 1 of the present embodiment, the pressing member P3 is a driven roller configured to be rotatable along with the movement of the belt T.

Thus, in the transfer device 1 of the present embodiment, since the pressing member P3 is the driven roller that rotates along with the movement of the belt T, as compared with a case where the pressing member P3 presses the belt T in a fixed state, it is possible to reduce the friction of the pressing member P3 with the belt T and to make uniform the tension of the belt T on both sides of the pressing member P3.

Second Embodiment

A transfer device according to a second embodiment of the present disclosure will be described. The main difference between the transfer device of the present embodiment and the transfer device of the first embodiment resides in the configuration of the belt transmission mechanism D. Therefore, the configurations of the transfer device of the present embodiment which are the same as those of the transfer device of the first embodiment will not be described.

Figure 6:
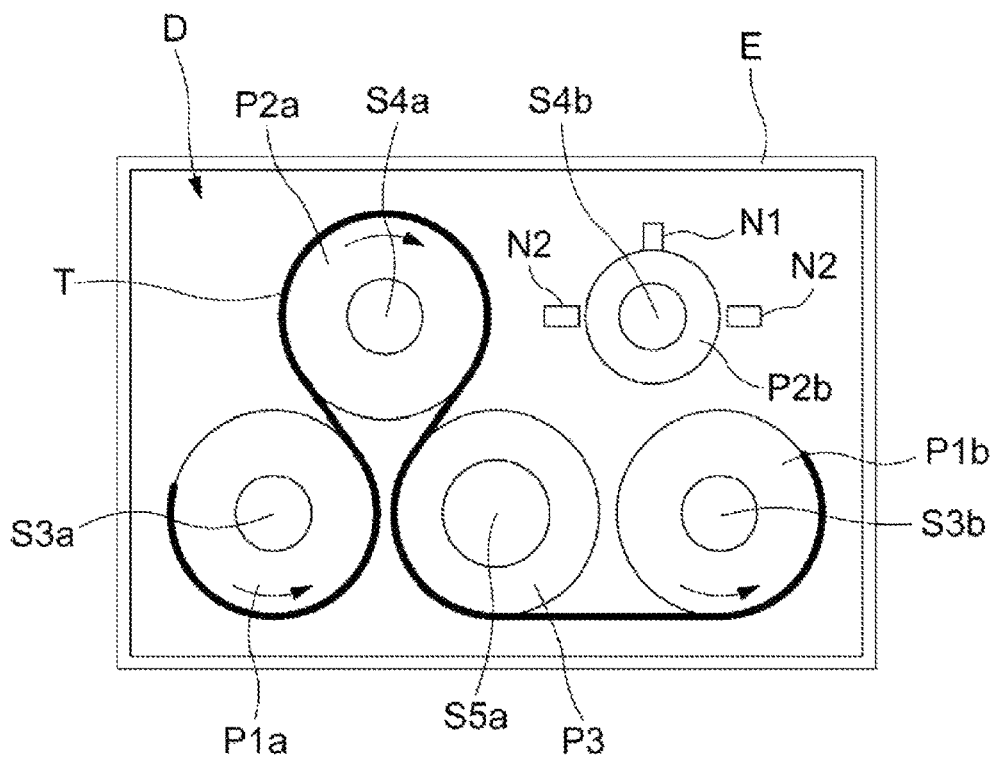
FIG. 6 is a plan view showing a belt transmission mechanism of a transfer device according to a second embodiment of the present disclosure.

As shown in FIG. 6, the belt transmission mechanism D, which is a configuration built in an intermediate link base E, includes pulley bodies P1*a*, P1*b* and P2*a*, a pressing member P3 and a belt T.

An intermediate connection shaft S4*b* supports a rotary plate P2*b*. A protrusion portion N1 protruding radially outward is formed on the outer circumferential surface of the rotary plate P2*b*. Furthermore, on both sides of the rotary plate P2*b* inside the intermediate link base E, there is provided a pair of restriction portions N2 against which the protrusion portion N1 abuts when the rotary plate P2*b* rotates. Therefore, the range in which the rotary plate P2*b* and the intermediate connection shaft S4*b* can rotate is limited with respect to the intermediate link base E. In the present embodiment, the protrusion portion N1 and the pair of restriction portions N2 constitute a rotation restriction part of the present disclosure. That is, the belt transmission mechanism D of the present embodiment differs from the belt transmission mechanism D of the first embodiment in that the belt transmission mechanism D of the present embodiment includes a rotation restriction part.

Referring to FIG. 6, when the rotary plate P2*b* rotates clockwise with respect to the intermediate link base E, the protrusion portion N1 can rotate until it abuts against the restriction portion N2 existing on the right side in FIG. 6. When the rotary plate P2*b* rotates counterclockwise with respect to the intermediate link base E, the protrusion portion N1 can rotate until it abuts against the restriction portion N2 existing on the left side in FIG. 6. Therefore, the range in which the second link L2*b* connected to the intermediate connection shaft S4*b* can rotate is limited with respect to the intermediate link base E.

That is, in the transfer device 1 of the present embodiment, the belt transmission mechanism D includes the rotation restriction part configured to restrict the range in which the second link L2*b* can rotate with respect to the intermediate link base E.

Thus, in the transfer device 1 of the present embodiment, breakage of the belt T can be prevented by restricting the range in which the second link L2*b* can rotate with respect to the intermediate link base E.

Third Embodiment

A transfer device according to a third embodiment of the present disclosure will be described. The main difference between the transfer device of the present embodiment and the transfer device of the first embodiment resides in the configuration of the belt transmission mechanism D. Therefore, the configurations of the transfer device of the present embodiment which are the same as those of the transfer device of the first embodiment will not be described.

Figure 7:
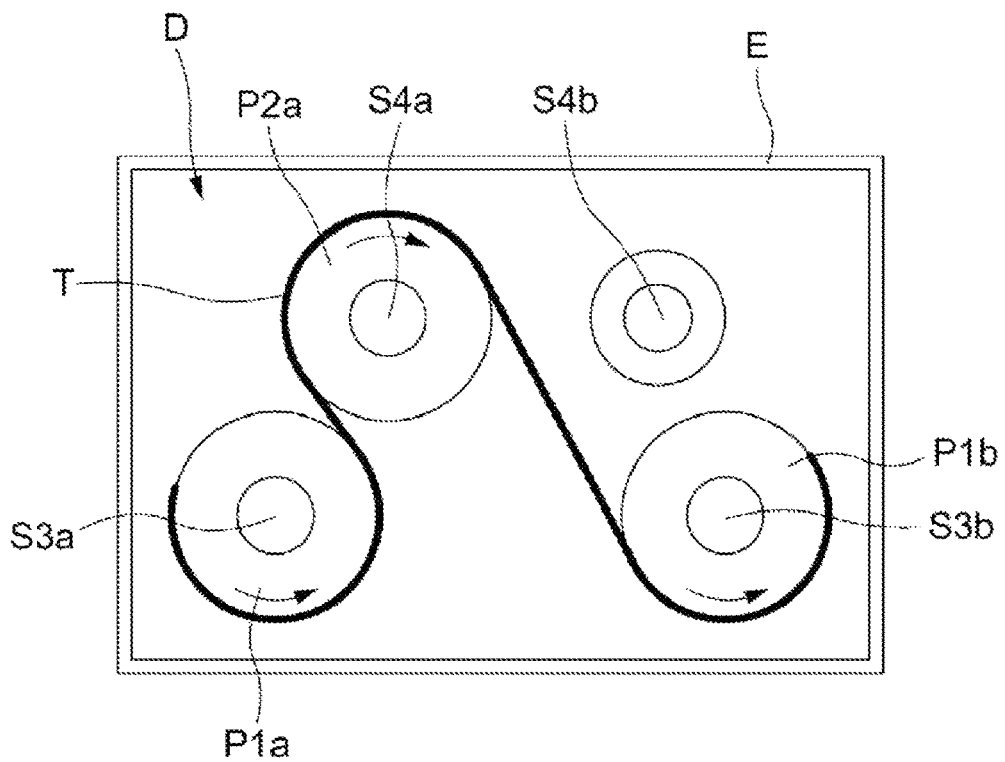
FIG. 7 is a plan view showing a belt transmission mechanism of a transfer device according to a third embodiment of the present disclosure.

As shown in FIG. 7, the belt transmission mechanism D, which is a configuration built in an intermediate link base E, includes pulley bodies P1$a$, P1$b$ and P2$a$ and a belt T. That is, the belt transmission mechanism D of the present embodiment differs from the belt transmission mechanism D of the first embodiment in that the belt transmission mechanism D of the present embodiment does not include the pressing member P3.

In the belt transmission mechanism D, the belt T is provided around the outer circumferential surfaces of the pulley bodies P1$a$, P2$a$ and P1$b$. The belt T is, for example, a steel belt. The belt T extends along the lower side of the outer circumferential surface of the pulley body P1$a$ and then extends along the upper side of the outer circumferential surface of the pulley body P2$a$. Thereafter, the belt T extends along the lower side of the outer circumferential surface of the pulley body P1$b$. The opposite end portions of the belt T are respectively fixed to the outer peripheral portions of the pulley body P1$a$ and the pulley body P1$b$ via a plurality of bolts (not shown).

Fourth Embodiment

A transfer device according to a fourth embodiment of the present disclosure will be described. The main difference between the transfer device of the present embodiment and the transfer device of the first embodiment resides in the configuration of the belt transmission mechanism D. Therefore, the configurations of the transfer device of the present embodiment which are the same as those of the transfer device of the first embodiment will not be described.

Figure 8:
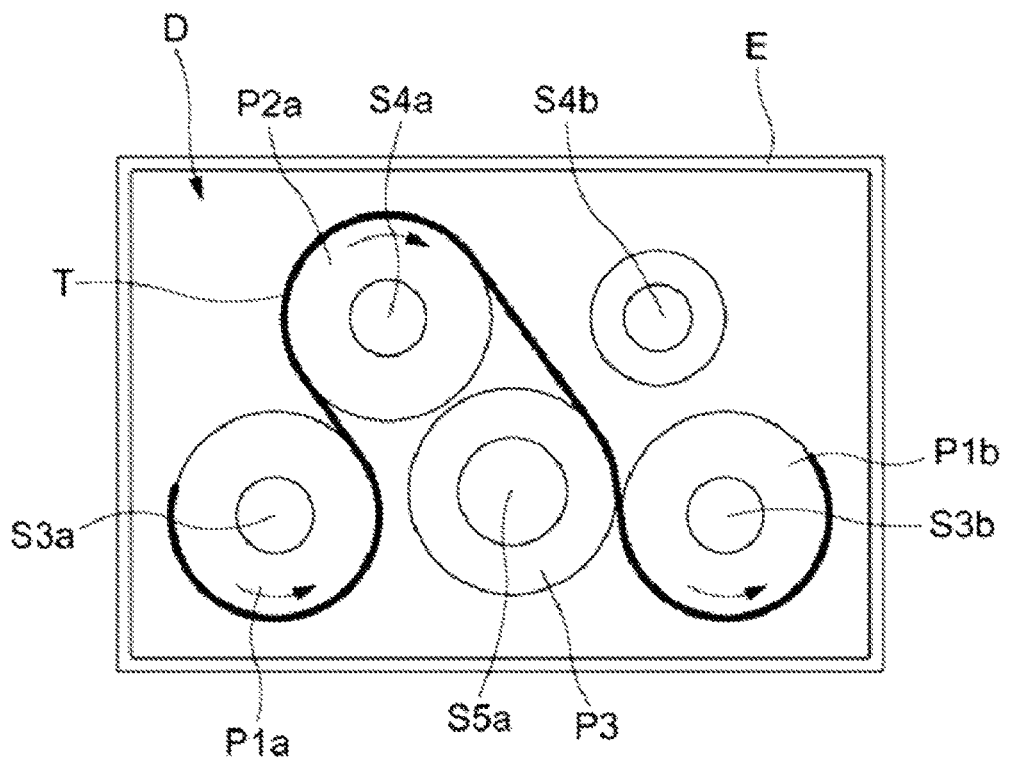
FIG. 8 is a plan view showing a belt transmission mechanism of a transfer device according to a fourth embodiment of the present disclosure.

As shown in FIG. 8, the belt transmission mechanism D, which is a configuration built in an intermediate link base E, includes pulley bodies P1$a$, P1$b$ and P2$a$, a pressing member P3 and a belt T.

The pressing member P3 is supported by a shaft S5$a$ rotatably supported by the intermediate link base E and is formed of a driven roller that can rotate as the belt T moves. The pressing member P3 presses the belt T obliquely in the upper right direction and adjusts the tension of the belt T between the pulley body P2$a$ and the pulley body P1$b$. That is, the belt transmission mechanism D of the present embodiment differs from the belt transmission mechanism D of the first embodiment in the direction in which the pressing member P3 presses the belt T. Therefore, the pressing member P3 is formed of a tension adjustment part DT configured to adjust the tension of the belt T provided around the pulley bodies P1$a$, P2$a$ and P1$b$ by moving with respect to the intermediate link base E so that the pressing force against the belt T is changed.

Other configurations may be variously modified without departing from the spirit of the present disclosure.

In the above-described embodiments, the two-arm type transfer device including the transfer units 11$a$ and 11$b$ has been described. However, the transfer device of the present disclosure may be a one-arm type transfer device including one of the transfer units 11$a$ and 11$b$.

In the above-described embodiments, the belt T of the belt transmission mechanism D is provided around the outer circumferential surfaces of the pulley body P1$a$ connected to the first link L1$a$, the pulley body P2$a$ connected to the second link L2$a$ and the pulley body P1$b$ connected to the first link L1$b$. The opposite end portions of the belt T are fixed to the outer peripheral portions of the pulley body P1$a$ and the pulley body P1$b$. However, the belt transmission mechanism D may include a pulley body P2$b$ connected to the second link L2$b$. The belt T may be provided around the outer circumferential surfaces of the pulley body P1$a$ connected to the first link L1$a$, the pulley body P2$b$ connected to the second link L2$b$ and the pulley body P1$b$ connected to the first link L1$b$. The opposite end portions of the belt T may be fixed to the outer peripheral portions of the pulley body P1$a$ and the pulley body P1$b$. Therefore, by providing the belt T so that the pulley bodies P1$a$ and P1$b$ are disposed on both sides of the pulley body P2$b$, even if the pulley body P2$b$ is in a released state, the rotation of the belt T can be restricted by fixing the belt T to the pulley bodies P1$a$ and P1$b$. It is therefore possible to prevent the pulley body P2$b$ having a released state from being rotated in the loosening direction and to prevent the tension of the belt T from being reduced.

In the above-described embodiments, there has been described the case where the first link mechanism LD1 for connecting the fixing base A as the first link base and the intermediate link base E is used as the first parallel four-joint link mechanism of the present disclosure and the second link mechanism LD2 for connecting the intermediate link base E and the distal end link plate C as the second link base is used as the second parallel four-joint link mechanism of the present disclosure. However, the second link mechanism LD2 for connecting the distal end link plate C as the first link base and the intermediate link base E may be used as the first parallel four-joint kink mechanism of the present disclosure, and the first link mechanism LD1 for connecting the intermediate link base E and the fixing base A as the second link base may be used as the second parallel four-joint link mechanism of the present disclosure.

In this case, the belt transmission mechanism D may include a pulley body P2$b$ connected to the second link L2$b$. The belt T may be provided around the outer circumferential surfaces of the pulley body P2$a$ connected to the second link L2$a$, the pulley body P1$a$ connected to the first link L1$a$ and the pulley body P2$b$ connected to the second link L2$b$. The opposite end portions of the belt T may be fixed to the outer peripheral portions of the pulley body P2$a$ and the pulley body P2$b$. Furthermore, the belt transmission mechanism D may include a pulley body P2$b$ connected to the second link L2$b$. The belt T may be provided around the outer circumferential surfaces of the pulley body P2$a$ connected to the second link L2$a$, the pulley body P1$b$ connected to the first link L1$b$ and the pulley body P2$b$ connected to the second link L2$b$. The opposite end portions of the belt T may be fixed to the outer peripheral portions of the pulley body P2$a$ and the pulley body P2$b$.

In the above-described embodiments, the rotational driving force of the third connection shaft S3$a$ in the belt transmission mechanism D is transmitted to the fourth connection shaft S4$a$ and the third connection shaft S3$b$ by the pulley body P1$a$ integrally connected to the third connection shaft S3$a$, the pulley body P2$a$ integrally connected to the fourth connection shaft S4$a$, the pulley body P1$b$ integrally connected to the third connection shaft S3$b$ and the belt T provided around the pulley bodies P1$a$, P2$a$ and P1$b$. However, the rotational driving force of the third connection shaft S3$a$ may be transmitted to the fourth connection shaft S4$a$ and the third connection shaft S3$b$ by the meshing of a gear integrally connected to the third connection shaft S3$a$, a gear integrally connected to the fourth connection shaft S4*a* and a gear integrally connected to the third connection shaft S3*b*.

According to the present disclosure in some embodiments, it is possible to provide a transfer device capable of improving the stability of belt tension and the accuracy of arm parallelism.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer device comprising:
    a first parallel four-joint link mechanism in which base end portions of a pair of first links are rotatably connected to a first link base and distal end portions of the pair of first links are rotatably connected to an intermediate link base, the pair of first links having the same length;
    a second parallel four-joint link mechanism in which base end portions of a pair of second links are rotatably connected to the intermediate link base and distal end portions of the pair of second links are rotatably connected to a second link base, the pair of second links having the same length; and
    a belt transmission mechanism that is disposed at the intermediate link base, and includes:
        a pair of first pulleys respectively connected to the pair of first links;
        a second pulley connected to one of the pair of second links; and
        a belt provided around the pair of first pulleys and the second pulley,
    wherein the belt transmission mechanism is configured to transmit a rotational driving force such that the pair of first links and the pair of second links rotate in opposite directions to each other.

2. The transfer device of claim 1, wherein the belt transmission mechanism includes a tension adjustment part configured to adjust tension of the belt.

3. The transfer device of claim 2, wherein the tension adjustment part includes a pressing member configured to be movable with respect to the intermediate link base such that a pressing force against the belt is changed.

4. The transfer device of claim 3, wherein the tension adjustment part includes one pressing member.

5. The transfer device of claim 3, wherein the pressing member is a driven roller configured to be rotatable along with movement of the belt.

6. The transfer device of claim 4, wherein the pressing member is a driven roller configured to be rotatable along with movement of the belt.

7. The transfer device of claim 1, wherein the belt transmission mechanism includes a rotation restriction part configured to restrict a range in which the other of the pair of second links is rotatable with respect to the intermediate link base.

8. The transfer device of claim 2, wherein the belt transmission mechanism includes a rotation restriction part configured to restrict a range in which the other of the pair of second links is rotatable with respect to the intermediate link base.

9. The transfer device of claim 3, wherein the belt transmission mechanism includes a rotation restriction part configured to restrict a range in which the other of the pair of second links is rotatable with respect to the intermediate link base.

10. The transfer device of claim 4, wherein the belt transmission mechanism includes a rotation restriction part configured to restrict a range in which the other of the pair of second links is rotatable with respect to the intermediate link base.

11. The transfer device of claim 5, wherein the belt transmission mechanism includes a rotation restriction part configured to restrict a range in which the other of the pair of second links is rotatable with respect to the intermediate link base.

12. The transfer device of claim 6, wherein the belt transmission mechanism includes a rotation restriction part configured to restrict a range in which the other of the pair of second links is rotatable with respect to the intermediate link base.

* * * * *